United States Patent
Haddad et al.

(10) Patent No.: US 7,697,650 B2
(45) Date of Patent: Apr. 13, 2010

(54) METHOD AND APPARATUS FOR HIGH RESOLUTION MEASUREMENT OF SIGNAL TIMING

(75) Inventors: Bassel Haddad, Haifa (IL); Jacob Finkelstein, Kfar-Saba (IL)

(73) Assignee: Zoran Corporation, Sunnyvale, CA (US)

( * ) Notice: Subject to any disclaimer, the term of this patent is extended or adjusted under 35 U.S.C. 154(b) by 700 days.

(21) Appl. No.: 11/277,400

(22) Filed: Mar. 24, 2006

(65) Prior Publication Data

US 2007/0223634 A1    Sep. 27, 2007

(51) Int. Cl.
*H04L 7/00* (2006.01)
(52) U.S. Cl. .................. 375/371; 369/47.28; 375/327; 375/375; 702/57
(58) Field of Classification Search .................. 375/371; 702/57
See application file for complete search history.

(56) References Cited

U.S. PATENT DOCUMENTS

| | | | |
|---|---|---|---|
| 4,620,788 A | 11/1986 | Giger | |
| 4,807,146 A * | 2/1989 | Goodrich et al. | .............. 702/57 |
| 5,067,138 A | 11/1991 | Van Rens et al. | |
| 5,559,841 A | 9/1996 | Pandula | |
| 5,963,518 A | 10/1999 | Kobayashi et al. | |
| 6,307,696 B1 | 10/2001 | Bishop et al. | |
| 2004/0095863 A1 | 5/2004 | Verboom et al. | |
| 2004/0145982 A1 | 7/2004 | Tsai et al. | |

FOREIGN PATENT DOCUMENTS

JP    2003-078409    *    3/2003
JP    2003 078409 A        3/2003

* cited by examiner

*Primary Examiner*—David C Payne
*Assistant Examiner*—Adolf Dsouza
(74) *Attorney, Agent, or Firm*—Lando & Anastasi, LLP

(57) ABSTRACT

A phase measurement system for measuring phase between an input signal having a frequency and a reference signal having a substantially different frequency includes: a phase comparator having an output representing a time between a crossing of a first threshold by a clock derived from the reference signal and a predetermined time along an interval from a first sample to a second sample, where the input signal crosses a second threshold on the interval; an interpolator having an output indicative of an interpolated time of the second-threshold-crossing on the interval in the input signal; and a phase calculator which computes the phase difference by combining the phase comparator output and the interpolator output.

33 Claims, 4 Drawing Sheets

METHOD AND APPARATUS FOR HIGH RESOLUTION MEASUREMENT OF SIGNAL TIMING

BACKGROUND

The present invention relates generally to apparatus and methods for accurately determining, measuring or matching the time or phase of an input signal with the time or phase of a reference, such as done in a phase-locked loop (PLL). More particularly, the invention relates to any such apparatus or methods used in connection with any communication channel employing a known carrier wave. Yet more particularly, the invention relates to such apparatus and methods as applied to the field of matching the phase of a wobble signal recovered from a recordable/writable or re-writable Digital Versatile Disk (DVD), Compact Disk (CD), Blue-ray media and HD-DVD media very precisely to the phase of a write clock having a frequency several orders of magnitude greater than that of the wobble signal.

In certain data storage systems, including DVD media, recoding equipment and playback equipment, several signals are used to extract timing information and facilitate recording and playback of information. In the following discussion, several signals are referred to. Analogous signals are found in communication channels employing a known carrier wave, as would be understood by the skilled artisan. They are defined as follows:

Definition List 1

| Term | Definition |
| --- | --- |
| Write clock (wclk) | The write clock is a signal derived from the wobble signal in a fixed phase and frequency relationship thereto and is used to time the recording/writing of eight-to-fourteen modulation (EFM) and eight-to-fourteen modulation plus (EFMP) data signals to the media. |
| Wobble signal | The wobble signal is a signal that varies in correspondence with a physical, sinusoidal wobble incorporated into the tracks of the media at the time of manufacture. The wobble signal varies sinusoidally about a median, or zero, value, with a constant carrier frequency, $f_{wobble}$. |
| Digital wobble signal | The digital wobble signal is a sequence of digital values representing samples of the wobble signal, taken at a sample rate greater than or equal to the Nyquist rate for the wobble signal. |
| Reference clock | The reference clock is a clock signal formed by dividing the write clock by an integer divisor and having a frequency substantially equal to that of the wobble signal. |

A conventional PLL solution, accurately matching the phase of the recovered reference clock, to the phase of the wobble signal is shown in FIG. 1. The write clock, wclk, is divided by divider, 104, to form the reference clock, at the same frequency as the wobble signal. In DVD+R/RW media, the write clock has a frequency, $f_{wclk}$, 32 times the frequency of the wobble signal; while in DVD-R/RW media, the write clock has a frequency, $f_{wclk}$, 186 times the frequency of the wobble signal. The reference clock and the wobble signal are applied to a phase comparator, 101, which digitally compares the phase of its inputs with a resolution finer than the frequency of the write clock, producing a control signal, for example a voltage signal, which is applied to a controllable oscillator, for example a voltage-controlled oscillator (VCO), 102. The output of the VCO, 102, may be a high speed clock from which the resolution of the phase comparator is derived, and which is divided by divider, 103, to form the high-frequency write clock, wclk, and which is divided down further to form the reference clock.

Conventional solutions are expensive and inadequately robust because it is difficult, in general, to produces a high-frequency signal having low phase jitter by phase locking two signals of frequencies several orders of magnitude lower than the frequency of the high-frequency signal to be produced. The resulting wclk accuracy and jitter depends on the resolution employed in the phase comparator/detector. The higher the resolution of the phase comparator relative to the frequency of the wclk signal, the more accurate wclk will be derived. Because the wclk frequency is scaled with the recording speed, and further because new DVD standards and associated media support increasing recording speeds, conventional solutions would impose a very high phase comparator resolution.

SUMMARY

Therefore, what is desired is an apparatus and/or a method which can produce the required phase measurement with very high accuracy and at low cost.

According to aspects of embodiments of the invention, for example for optical media, a wobble signal recovery Phase Lock Loop (PLL) circuit includes a digital phase measurement architecture. The mission of this PLL is to phase synchronize a derived channel bit rate clock to the wobble signal present on the media being recorded. The derived channel bit rate clock is used as the processing clock in the detection/decoding of the physical address and disc information. It is additionally employed in the generation of write strategy timing pulses. The proposed concept defines a digital phase detection scheme (as part of the PLL) which is able to produce high resolution phase error measurements at very high recording speeds, with the use of low wobble signal sampling rates relative to the resolution required using conventional techniques.

Aspects of embodiments of the invention use interpolation, in combination with digital phase detection and a low reference wobble signal A/D sampling rate, to produce a write clock output with low phase jitter. Embodiments of the present concept provide high resolution wobble signal zero crossing timing (phase error) information, with significantly lower sampling rate.

The high-resolution, phase measurements made according to aspects of embodiments of the invention, while recording at high speeds, results in less write clock jitter and superior written data quality, as compared to conventional approaches. Devices incorporating the inventive technologies are capable of recording at faster speeds than conventional devices while maintaining recorded data quality.

According to aspects of one embodiment, a phase measurement system for measuring a phase difference between an input signal and a reference signal, comprises: a phase comparator having a first input receiving a first sample of the input signal and a second sample of the input signal and having a second input receiving a clock derived from the reference signal, the phase comparator having an output representing a time between a crossing of a first threshold by the clock and a predetermined time along an interval from the first sample to the second sample where the input signal crosses a second threshold on the interval; an interpolator coupled to the first input and having an output indicative of an interpolated time of the second-threshold-crossing on the interval in the input signal; and a phase calculator coupled to the phase comparator output and the interpolator output and which computes the phase difference by combining the phase comparator output and the interpolator output. According to one variation, the phase comparator further comprises: a first-threshold-crossing detector; a second-threshold-crossing detector; and counting logic that counts the time in units of an integral sub-multiple of the reference signal. According to another variation, the first threshold and the second threshold have a same value. According to yet another variation the value is a median value around which excursions of the input signal and the clock occur. In accordance with further variations, the interpolator further comprises logic which maps a combination of values of the first sample and the second sample to the time of the second-threshold-crossing. For example, the computational logic performs a first order, linear fit, interpolation, $$\frac{A}{A-B}(2^N-1),$$

on $2^N$ intervals between the first sample and the second sample, thus producing a resolution of $$\frac{2^N f_{high}}{R},$$

where A is a value of the input signal at the first sample, B is a value of the input signal at the second sample, and $f_{high}/R$ is a frequency of the reference signal divided by a constant. Alternatively, the computational logic may further comprise a lookup table containing the mapping.

According to aspects of another embodiment, a method of measuring a phase difference between a low-frequency input signal and a high frequency reference signal, comprises: sampling the input signal, producing at least a first sample and a second sample, between which the input signal crosses a first threshold value; measuring a time interval between a crossing of a second threshold value by the reference signal and a predetermined point in time on the interval from the first sample to the second sample; and combining the measured time interval with an interpolated time between the first sample and the second sample at which the input signal crosses the first threshold value. A variation of this embodiment includes: detecting a first-threshold-crossing in the input signal; detecting a second-threshold-crossing in the reference signal; and counting the time in units of an integral sub-multiple of the reference signal. According to another variation, the first threshold value and the second threshold value are equal. For example, the first threshold value is a median value around which excursions of the input signal occur and the second threshold value is a median value around which excursions of the clock occur. According to yet another variation, the method further includes mapping a combination of values of the first sample and the second sample to the time of the first-threshold-crossing. According to some variations, the method may comprise performing a first order, linear fit, interpolation, $$\frac{A}{A-B}(2^N-1),$$

on $2^N$ intervals between the first sample and the second sample, thus producing a resolution of $$\frac{2^N f_{high}}{R},$$

where A is a value of the input signal at the first sample, B is a value of the input signal at the second sample, and $f_{high}/R$ is a frequency of the reference signal divided by a constant. The method may yet further comprise looking up interpolation values in a table mapping combinations of the first sample and the second sample to the time of the first-threshold-crossing.

According to yet other aspects of embodiments of the invention, a method of synchronizing an input signal to a reference signal, comprises: measuring a time interval between a time when the reference signal crosses a first threshold value and a predetermined point on a time interval from a first sample of the input signal to a second sample of the input signal; combining, to form a phase error signal, the measured time interval with an interpolation of the input signal crossing a second threshold value between the first sample and the second sample; and adjusting timing of at least one of the reference signal and the input signal to the other of the reference signal and the input signal to reduce the phase error signal. A variation of this aspect includes computing the interpolation so as to map a combination of values of the first sample and the second sample to the time of the second-threshold-crossing. Yet a further variation includes computing a first order, linear fit, interpolation, $$\frac{A}{A-B}(2^N-1),$$

on $2^N$ intervals between the first sample and the second sample, thus producing a resolution of $$\frac{2^N f_{high}}{R},$$

where A is a value of the input signal at the first sample, B is a value of the input signal at the second sample, and $f_{high}/R$ is a frequency of the reference signal divided by a constant. The method may further comprise looking up interpolation values in a table mapping combinations of the first sample and the second sample to the time of the second-threshold-crossing.

According to another aspect of embodiments of the invention, apparatus for measuring a precise time span between a time at which an input signal crosses a threshold value and a reference time, includes: a time measurement module having a first input receiving a first sample of the input signal and a second sample of the input signal and having a second input receiving a reference periodically designating the reference time, the time measurement module having an output representing a time between the reference time and a predetermined time on an interval from the first sample to the second sample where the input signal crosses the threshold value on the interval; an interpolator coupled to the first input and having an output indicative of an interpolated time of the threshold-crossing on the interval in the input signal; and a time span calculator coupled to the time measurement module output and the interpolator output and which computes the time span by combining the time measurement module output and the interpolator output, whereby the time span is determined to a finer resolution than the interval from the first sample to the second sample. The time measurement module may further comprise counting logic that determines the time between the reference time and the time on the interval from the first sample to the second sample with a time measurement resolution finer than the reference. The interpolator may further comprise interpolation logic producing the output with an interpolation resolution finer than the time measurement resolution. According to further variations, interpolation further comprises logic which maps a combination of values of the first sample and the second sample to the time of the threshold-crossing. According to yet a further variation, the computational logic further comprises a lookup table containing the mapping. The input signal may be sampled at a frequency $f_{sample}$, and the computational logic may perform a first order, linear fit, interpolation, $$\frac{A}{A-B}(2^N - 1),$$

on $2^N$ intervals between the first sample and the second sample, thus producing a resolution of $2^N f_{sample}$, where A is a value of the input signal at the first sample, B is a value of the input signal at the second sample.

According to yet a further aspect of embodiments of the invention, a method of providing a signal representing a precise time span between a time at which an input signal crosses a threshold value and a reference time, comprises: sampling the input signal, producing at least a first sample and a second sample, between which the input signal crosses the threshold value; interpolating the time at which the input signal crosses the threshold value between the first sample and the second sample; and providing the signal representing the precise time span from the reference time to the interpolated time. Interpolating may further comprise mapping combinations of the first sample and the second sample as interpolated values, or may comprise performing a first order, linear fit interpolation between the first sample and the second sample. Interpolating may yet further comprise looking up the interpolated value in a table.

BRIEF DESCRIPTION OF THE DRAWINGS

In the figures, in which like reference designations indicate like elements.

DETAILED DESCRIPTION

Figure 1:
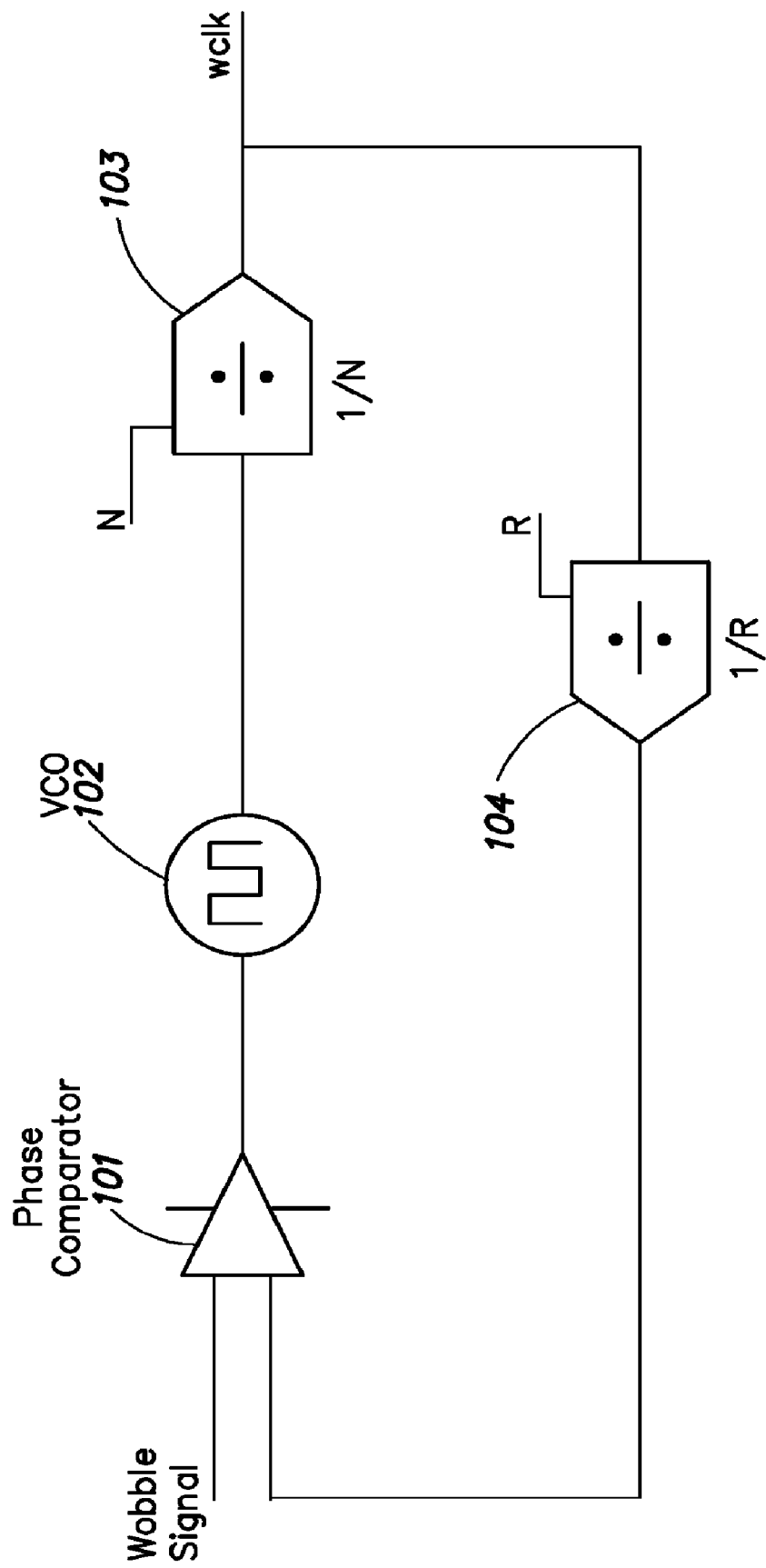
FIG. 1 is a block diagram of a conventional, accurate phased locked loop (PLL)

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

When writing on DVD+ or DVD-media at 16× or 24× speed, for example, the frequency of the write clock is about 420 MHz or 630 MHz, respectively. In order to achieve a low jitter write clock, the phase comparator resolution should be quite high relative to the write clock rate, resulting in the phase comparator circuit operating at very high frequencies, for example 1.68 GHz or 2.82 GHz, respectively, in the case of 4× write clock resolution in conventional schemes.

A phase measurement system measures the phase (a measure of time relative to the frequency of the signal measured) between the zero crossing points of a reference wobble signal recovered from the media and a reference clock derived from the write clock.

The proposed digital phase measurement system is able to produce high resolution phase error detection by applying digital processing techniques on a sampled reference wobble signal. Specifically, the reference wobble signal will be sampled using an analog-to-digital (A/D) converter and by applying interpolation techniques to obtain the zero crossing points with finer resolution than the sample rate of the A/D converter. The phase error will be calculated at a high resolution.

Embodiments of aspects of the invention rely upon the following:

(1) The wobble signal frequency is much lower than the write clock frequency, the ratio of wobble signal frequency to write clock frequency being dependent on the media type:
Ratio=32, DVD+R/RW media;
Ratio=186, DVD-R/RW media;
Ratio=196, CD-R/RW media; and
Ratio=186, DVD-RAM media.

(2) The above ratio permits a low A/D sampling frequency, since the only constraint on the A/D sampling frequency is that the sampling rate of the reference wobble signal is maintained above the Nyquist frequency.

(3) The Signal to Noise ratio (SNR) of the signal entering the A/D converter is quite high, all of the frequencies above the frequency of interest are highly attenuated by a preceding Band Pass Filter. This allows the use of an A/D converter with a low resolution. Expressed as a number of bits the resolution may be five bits or less, for example.

Figure 2:
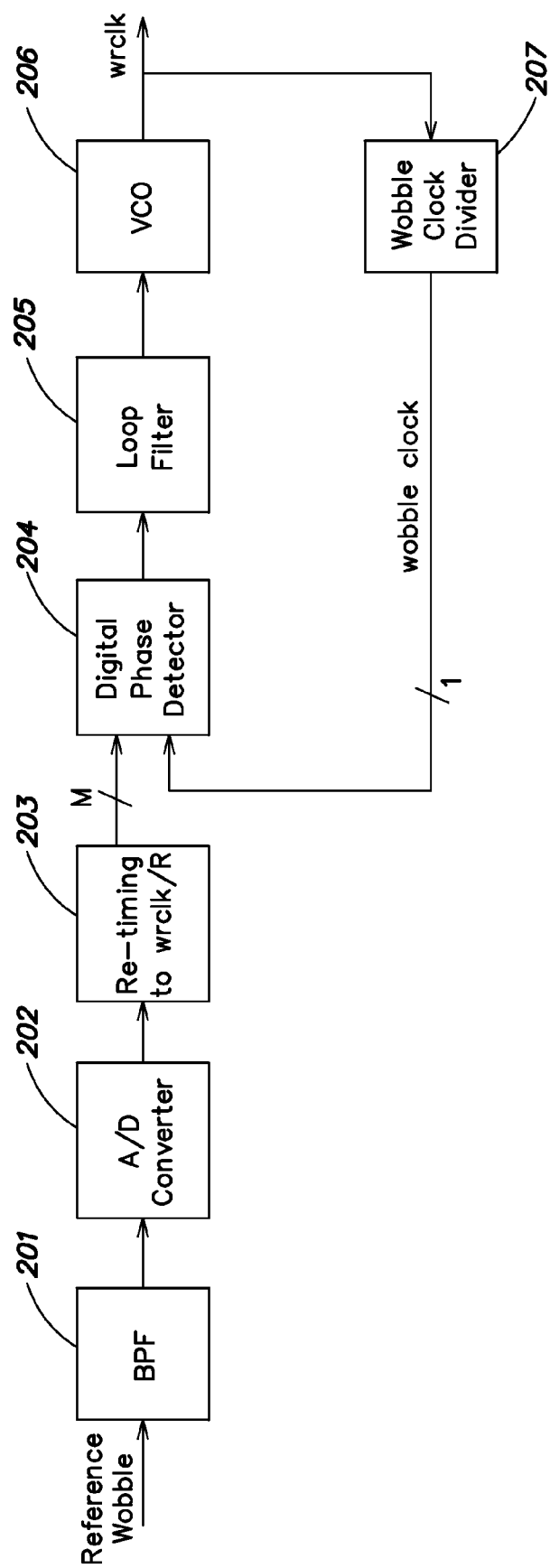
FIG. 2 is a block diagram of an embodiment of aspects of the invention.

As shown in FIG. 2, a reference wobble signal recovered from a DVD is first filtered by a band-pass filter (BPF), 201. It is then sampled using A/D converter, 202, having a modest sample rate and a modest resolution. Some embodiments of aspects of the invention use a retiming block, 203, because the sample clock of the A/D converter, 202, may not match the rate or phase of subsequent sequential logic in the system. This block performs a sampling rate conversion from the A/D sampling rate to the sampling rate used by the digital phase comparator, wclk/R, for example. The sampling rate conversion is achieved by applying any suitable interpolation and decimation filters techniques. Synchronization of the write clock, wclk, with the reference wobble is achieved by a PLL system including a digital phase comparator, 204, to be described in greater detail with respect to FIG. 3, a loop filter,

205, a Voltage Controlled Oscillator (VCO) or alternatively a Numerically Controlled Oscillator (NCO) or the like, 206, and a reference clock divider, 207, connected in a feedback configuration.

Figure 3:
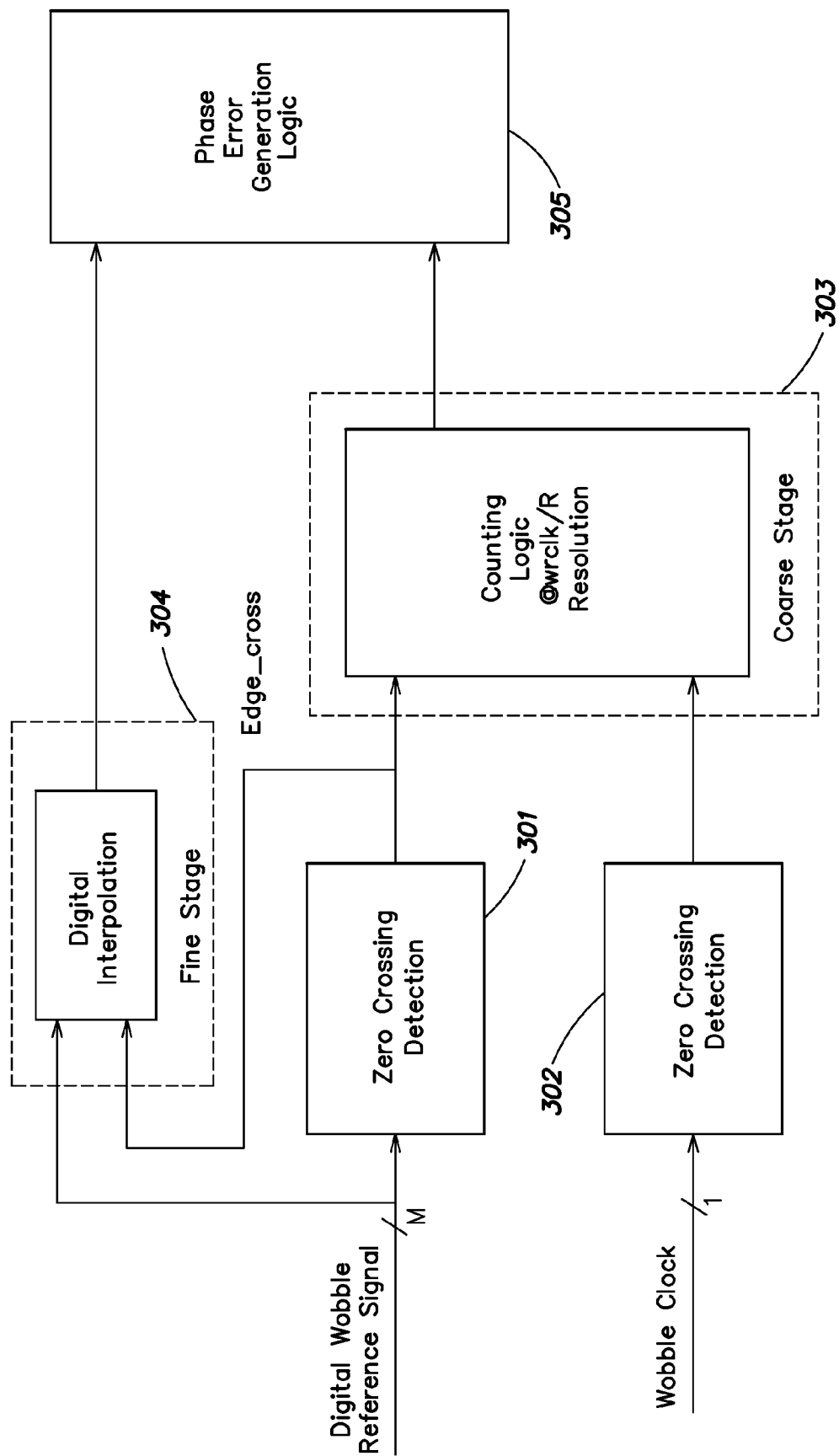
FIG. 3 is a block diagram of an embodiment of the digital phase measurement system block of FIG. 2.

In the phase comparator, 204, of this exemplary embodiment, as shown in FIG. 3, the phase error is computed in two stages, coarse and fine, which are combined in Phase Generation logic 305.

Coarse Stage

The coarse stage, 303, of the exemplary embodiment produces an output representing the phase error with a resolution of wclk/R, where R=1, 2, 3, 4 . . . . The technique used is based on counting the difference in units of wclk/R between a sample near the zero crossing point of the digital wobble reference signal, and the reference clock derived in the PLL from write clock, wclk. (see Wobble Clock and Zero Crossing Detection 302.)

In one preferred embodiment, the counting logic operates as follows. A counter is triggered to start counting on one of two events, and then triggered to stop counting on a second one of two events. The counter is triggered to start counting on the occurrence of either of the two events: (i) the leading edge of the wobble clock, wclk/R; or (ii) the time of a sample of the digital wobble signal when that sample is followed immediately by a sample having an opposite polarity referenced to the zero level. The counter is incremented at the rate wclk/R until one of (i) the next time of a sample of the digital wobble signal when that sample is followed immediately by a sample having an opposite polarity referenced to the zero level; or (ii) the next time of the leading edge of the wobble clock, wclk/R, respectively.

Fine Stage

The Fine Stage, 304, of the exemplary embodiment employs a digital interpolation technique. The interpolation unit, 304, as shown in FIG. 3, receives from the zero crossing detection unit, 301, a signal, edge_cross, indicating that a zero crossing point occurred between the previous two samples of the digital wobble signal. The time between the two samples, $R/f_{wclk}$, where $f_{wclk}$ is the write clock frequency and R is an integer divisor, is divided into $2^N$ equal intervals. The resultant resolution is:

$$\frac{2^N f_{wclk}}{R} \text{Hz}.$$

The interpolation circuit could be implemented in a number of different ways. Two such methods are now described. One approach is the Table Lookup approach and the other is the Formula approach. In order to better understand those approaches, reference is now made to FIGS. 3 and 4. The exemplary interpolation unit, 304, receives the wobble signal in the form of a sequence of digital values, including the values of each of the two samples, denoted A and B. One sample would be above the median or zero value, "positive;" and the other sample would be below the median or zero value, "negative." Based on these values, the exact zero crossing point is deduced.

In the Table Lookup approach, the two digital wobble signal sample values, A and B, are provided to a table which relates these values to an N-bit number representing the relative location of the interpolated zero crossing point between the two samples. In this example, a value of zero means that the zero crossing coincides with the sample having the value A, and a value of $2^N-1$ means that the zero crossing coincides with the sample having the value B. Intermediate values represent zero-crossings between the time of the sample having value A and the time of the sample having value B.

Figure 4:
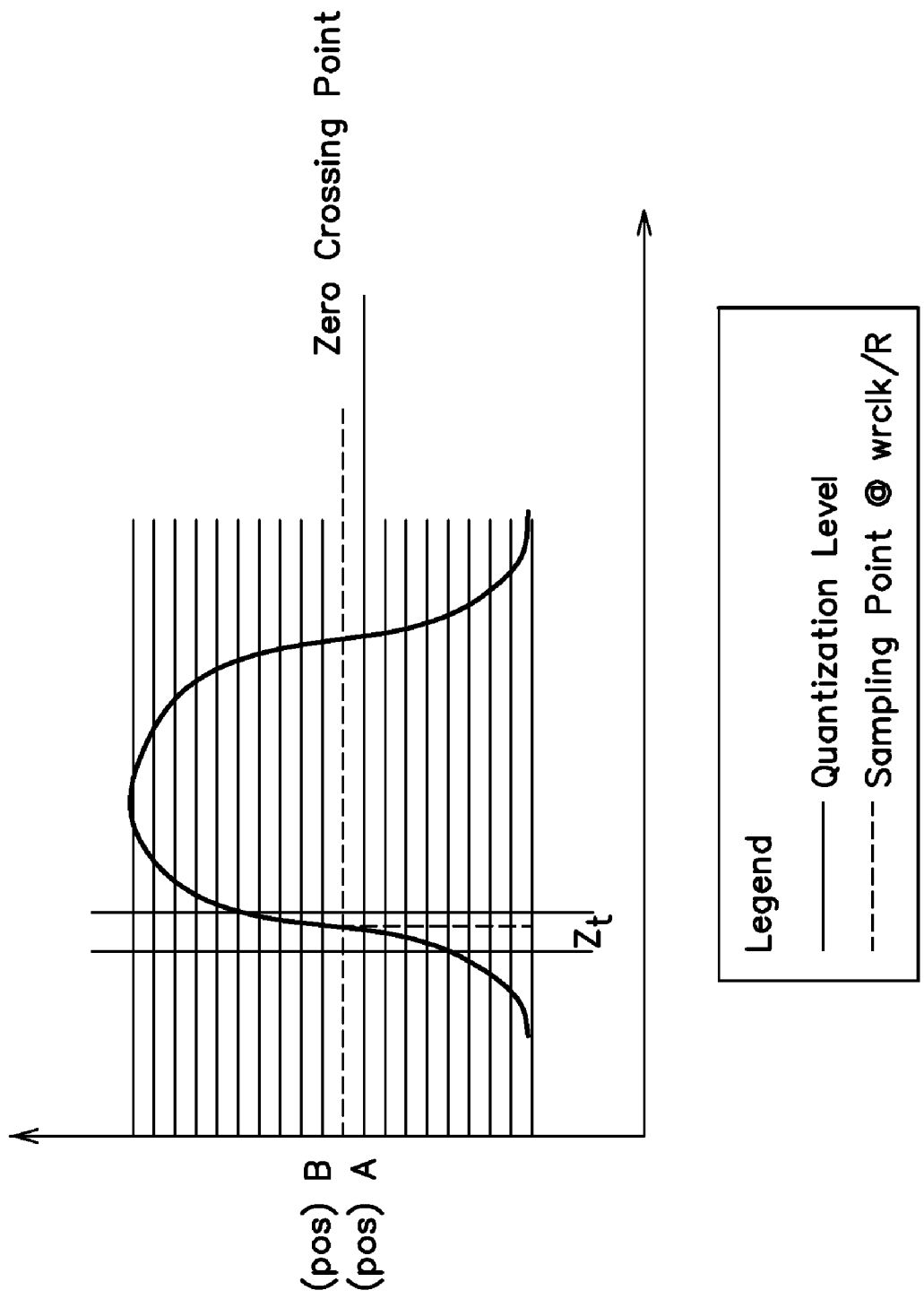
FIG. 4 is a waveform diagram illustrating timing relationships betweens signals used in the exemplary embodiment.

The Formula-Based approach is now described referring to FIGS. 3 and 4. A first order, linear fit, interpolation expression that can be used is:

$$\frac{A}{A-B}(2^N - 1).$$

In this example, a value of zero means that the zero crossing coincides with the sample having the value A, and a value of $2^N-1$ means that the zero crossing coincides with the sample having the value B. Using the exemplary expression, if A and B are equal in absolute value, then the zero-crossing point will be midway between these two samples and the formula will produce the value $(2^N-1)/2$.

The adjusted phase error term will be formed by the combination of the output of the coarse stage and the output of the fine stage. In the preferred embodiment, the coarse stage produces the most significant bits of the adjusted phase error term, at the resolution of $f_{wclk}/R$, while the fine stage produces the LSB of the phase error term at the resolution of:

$$\frac{2^N f_{wclk}}{R}.$$

Thus, the bits produced by each stage are merely concatenated to produce the complete adjusted phase error term.

Fine stage interpolation according to the exemplary embodiment takes advantage of the fact that a sinusoidal input signal is substantially linear in the vicinity of the zero-crossing. The exemplary embodiment, whether using the Table Lookup approach or the Formula-based approach, implements a first-order, linear fit, interpolation. This choice assumes that all of the points of the signal to be interpolated between the sample having value A and the sample having value B lie on a substantially straight line. See FIG. 4. If used for other signal forms, other suitable interpolation formulae can be used, but the exemplary embodiment does assume a low-noise wobble signal, so that interpolation is a valid approach.

According to the exemplary embodiment, the PLL is locked to a single-tone, sinusoidal signal at the wobble frequency. The exemplary embodiment does not use information concerning the overall amplitude of the sampled digital wobble signal anywhere along the detection path. Digital interpolation accuracy can be increased, without increasing the A/D converter sampling rate or the number of A/D converter bits. This increase in accuracy can be obtained by allowing the amplitude of the wobble signal entering the A/D to be greater that the A/D input saturation level, thereby causing the apparent amplitude resolution of the samples close to the zero crossing point to be higher than if a non-saturating input were used. This apparent amplitude resolution increase results from throwing away information regarding that portion of the wobble signal far from the zero crossing, but increasing how much of the available amplitude range of the A/D converter is used by samples close to the zero crossing. Alternatively, if a lower A/D sampling rate (i.e., lower time resolution) and/or the use of an A/D converter with fewer bits of amplitude resolution is desired, a similar interpolation accuracy can be achieved by using this approach.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A phase measurement system for measuring a phase difference between an input signal having a first frequency and embedded in a medium separate from user information carried by the medium and a write data timing reference signal having a second frequency in an approximate range of 32 to 196 times the first frequency, the phase measurement system comprising:
a phase comparator having a first input receiving a first sample of the input signal and a second sample of the input signal and having a second input receiving a clock derived from the write data timing reference signal, the phase comparator having an output representing a time between a crossing of a first threshold by the clock and a predetermined time along an interval from the first sample to the second sample where the input signal crosses a second threshold on the interval;
an interpolator coupled to the first input and having an output indicative, at a resolution that is a fraction less than one period of the write data timing reference signal having the second frequency, of an interpolated time of the second-threshold-crossing on the interval in the input signal;
a phase calculator coupled to the phase comparator output and the interpolator output and which computes the phase difference relative to the second frequency by combining the phase comparator output and the interpolator output; and
a write data output circuit producing a write data output to the medium having timing based on the write data timing reference signal at the second frequency.

2. The phase measurement system of claim 1, wherein the phase comparator further comprises:
a first-threshold-crossing detector;
a second-threshold-crossing detector; and
counting logic that counts the time in units of an integral sub-multiple of the reference signal.

3. The phase measurement system of claim 2, wherein the first threshold and the second threshold have a same value.

4. The phase measurement system of claim 3, wherein the value is a median value around which excursions of the input signal and the clock occur.

5. The phase measurement system of claim 1, wherein the interpolator further comprises logic which maps a combination of values of the first sample and the second sample to the time of the second-threshold-crossing.

6. The phase measurement system of claim 5, wherein the computational logic performs a first order, linear fit, interpolation, $$\frac{A}{A+B}(2^N - 1),$$

on $2^N$ intervals between the first sample and the second sample, thus producing a resolution of $$\frac{2^N f_{high}}{R},$$

where A is a value of the input signal at the first sample, B is a value of the input signal at the second sample, N is an integer and $f_{high}/R$ is a frequency of the reference signal divided by a constant.

7. The phase measurement system of claim 5, wherein the computational logic further comprises a lookup table containing the mapping.

8. The system of claim 1, further comprising:
an analog-to-digital (A/D) converter receiving the input signal at an input and producing at an output samples which saturate for peak values of the input signal, whereby an effective resolution of the first sample and the second sample is higher than if the A/D converter produced no output samples which saturate for the peak values of the input signal.

9. A method of writing user information to a medium, including measuring a phase difference between a low-frequency input signal embedded in the medium separate from user information canied by the medium and a write data timing reference signal having a frequency in an approximate range of 32 to 196 times the low-frequency input signal, the method comprising:
receiving the input signal into a digital phase measurement system;
sampling the input signal with a resolution sufficient to determine a phase of the low-frequency input signal, producing at least a first sample and a second sample, between which the input signal crosses a first threshold value;
measuring a time interval between a crossing of a second threshold value by the reference signal and a predetermined point in time on the interval from the first sample to the second sample;
combining the measured time interval with an interpolated time having a resolution that is a fraction that is less than one period of the write data timing reference signal between the first sample and the second sample at which the input signal crosses the first threshold value to produce a measured phase difference output; and
producing a user information write data output to the medium having timing based on the write data timing reference signal at the frequency between about 32 times and about 196 times the low-frequency input signal.

10. The method of claim 9, further comprising:
detecting a first-threshold-crossing in the input signal;
detecting a second-threshold-crossing in the reference signal; and
counting the time in units of an integral sub-multiple of the reference signal.

11. The method of claim 10, wherein the first threshold value and the second threshold value are equal.

12. The method of claim 10, wherein the first threshold value is a median value around which excursions of the input signal occur and the second threshold value is a median value around which excursions of the clock occur.

13. The method of claim 9, further comprising mapping a combination of values of the first sample and the second sample to the time of the first-threshold-crossing.

14. The method of claim 13, further comprising performing a first order, linear fit, interpolation, $$\frac{A}{A+B}(2^N-1),$$

on $2^N$ intervals between the first sample and the second sample, thus producing a resolution of $$\frac{2^N f_{high}}{R},$$

where A is a value of the input signal at the first sample, B is a value of the input signal at the second sample, N is an integer and $f_{high}/R$ is a frequency of the reference signal divided by a constant.

15. The method of claim 13, further comprising looking up interpolation values in a table mapping combinations of the first sample and the second sample to the time of the first-threshold-crossing.

16. The method of claim 9, wherein sampling further comprises:
producing samples which saturate for peak values of the input signal, whereby an effective resolution of the first sample and the second sample is higher than if no samples saturate for the peak values of the input signal.

17. A method of synchronizing an input signal having a first frequency and embedded in a medium separate from user information carried by the medium to a write data timing reference signal having a second frequency in an approximate range of 32 to 196 times higher than the first frequency and produced by a digital phase locking system, to a resolution that is a fraction that is less than one period of the reference signal, comprising:
receiving the input signal into the digital phase locking system;
measuring a time interval between a time when the reference signal crosses a first threshold value and a predetermined point on a time interval from a first sample of the input signal to a second sample of the input signal;
combining, to form a phase error signal, the measured time interval with an interpolation of the input signal crossing a second threshold value between the first sample and the second sample at a resolution that is the fraction that is less than one period of the reference signal;
adjusting timing of at least one of the write data timing reference signal and the input signal to the other of the write data timing reference signal and the input signal to reduce the phase error signal; and
writing data to the medium using timing based on the write data timing reference signal.

18. The method of claim 17, further comprising computing the interpolation so as to map a combination of values of the first sample and the second sample to the time of the second-threshold-crossing.

19. The method of claim 18, further comprising computing a first order, linear fit, interpolation, $$\frac{A}{A+B}(2^N-1),$$

on $2^N$ intervals between the first sample and the second sample, thus producing a resolution of $$\frac{2^N f_{high}}{R},$$

where A is a value of the input signal at the first sample, B is a value of the input signal at the second sample, N is an integer and $f_{high}/R$ is a frequency of the reference signal divided by a constant.

20. The method of claim 18, further comprising looking up interpolation values in a table mapping combinations of the first sample and the second sample to the time of the second-threshold-crossing.

21. The method of claim 17, further comprising:
producing samples of the input signal which saturate for peak values of the input signal, whereby an effective resolution of the first sample and the second sample is higher than if no samples saturate for the peak values of the input signal.

22. Apparatus for measuring a precise time span between a time at which an input signal having a first frequency crosses a threshold value and a reference time determined by a reference signal having a second frequency in an approximate range of 32 times to 196 higher than the first frequency, to a resolution that is a fraction that is less than one period of the reference signal and writing user information to a medium with timing based on the measured time span, the apparatus comprising:
a time measurement module having a first input receiving a first sample of the input signal and a second sample of the input signal and having a second input receiving a reference periodically designating the reference time, the time measurement module having an output representing a time between the reference time and a predetermined time on an interval from the first sample to the second sample where the input signal crosses the threshold value on the interval;
an interpolator coupled to the first input and having an output indicative of an interpolated time of the threshold-crossing on the interval in the input signal at the resolution that is the fraction that is less than one period of the reference signal; and
a time span calculator coupled to the time measurement module output and the interpolator output and which computes the time span by combining the time measurement module output and the interpolator output, whereby the time span is determined to a finer resolution than the interval from the first sample to the second sample; and
writing user information to the medium using timing determined by the time span computed by the time span calculator.

23. The apparatus of claim 22, wherein the time measurement module further comprises:
counting logic that determines the time between the reference time and the time on the interval from the first sample to the second sample with a time measurement resolution finer than the reference.

24. The apparatus of claim 23, wherein the interpolator further comprises:
interpolation logic producing the output with an interpolation resolution finer than the time measurement resolution.

25. The apparatus of claim 24, wherein interpolation further comprises logic which maps a combination of values of the first sample and the second sample to the time of the threshold-crossing.

26. The apparatus of claim 25, wherein the computational logic further comprises a lookup table containing the mapping.

27. The apparatus of claim 26, wherein the input signal is sampled at a frequency $f_{sample}$, and wherein the computational logic performs a first order, linear fit, interpolation, $$\frac{A}{A+B}(2^N - 1),$$

on $2^N$ intervals between the first sample and the second sample, thus producing a resolution of $2^N f_{sample}$, where A is a value of the input signal at the first sample, B is a value of the input signal at the second sample and N is an integer.

28. The apparatus of claim 22, further comprising:
an analog-to-digital (A/D) converter receiving the input signal at an input and producing at an output samples which saturate for peak values of the input signal, whereby an effective resolution of the first sample and the second sample is higher than if the A/D converter produced no output samples which saturate for the peak values of the input signal.

29. A method of locking write data timing to timing derived from an input signal having a first frequency recovered from a signal embedded in a medium separate from a user information signal, including providing a signal representing a precise time span between a time at which an input signal crosses a threshold value and a reference time determined by a reference signal having a second frequency in an approximate range of 32 to 196 times higher than the first frequency using a digital phase locking system, to a resolution that is a fraction that is less than one period of the reference signal, the method comprising:
sampling the input signal, producing at least a first sample and a second sample, between which the input signal crosses the threshold value;
interpolating the time at which the input signal crosses the threshold value between the first sample and the second sample at the resolution that is the fraction that is less than one period of the reference signal; and
providing the signal representing the precise time span from the reference time to the interpolated time; and
producing a write data output to the medium having timing based on the write data timing reference signal.

30. The method of claim 29, wherein interpolating further comprises:
mapping combinations of the first sample and the second sample as interpolated values.

31. The method of claim 30, wherein interpolating further comprises:
performing a first order, linear fit interpolation between the first sample and the second sample.

32. The method of claim 31, wherein interpolating further comprises:
looking up the interpolated value in a table.

33. The method of claim 29, wherein sampling further comprises:
producing samples which saturate for peak values of the input signal, whereby an effective resolution of the first sample and the second sample is higher than if no samples saturate for the peak values of the input signal.

* * * * *

UNITED STATES PATENT AND TRADEMARK OFFICE
CERTIFICATE OF CORRECTION

PATENT NO.        : 7,697,650 B2                                    Page 1 of 1
APPLICATION NO.   : 11/277400
DATED             : April 13, 2010
INVENTOR(S)       : Bassel Haddad et al.

It is certified that error appears in the above-identified patent and that said Letters Patent is hereby corrected as shown below:

In column 10, at line 25, (Claim 9, line 4) the word "canied" should be changed to read --carried--

At column 7, line 7, the words "Phase Generator logic" should be changed to read --Phase Error Generator Logic--

Signed and Sealed this

Twenty-fifth Day of May, 2010

David J. Kappos
*Director of the United States Patent and Trademark Office*